United States Patent [19]
Horiba

[11] Patent Number: 6,136,696
[45] Date of Patent: Oct. 24, 2000

[54] METHOD OF FORMING A SEMICONDUCTOR DEVICE WITH A CONDUCTOR PLUG INCLUDING FIVE DIELECTRIC LAYERS, THE FOURTH DIELECTRIC LAYER FORMING SIDEWALL SPACERS

[75] Inventor: Shinichi Horiba, Tokyo, Japan

[73] Assignee: NEC Corporation, Tokyo, Japan

[21] Appl. No.: 09/277,933

[22] Filed: Mar. 29, 1999

[30] Foreign Application Priority Data

Mar. 30, 1998 [JP] Japan ................................ 10-084624

[51] Int. Cl.⁷ ............................................. H01L 21/4763
[52] U.S. Cl. ......................... 438/639; 438/622; 438/624; 257/758
[58] Field of Search ................................. 257/758, 774; 438/622, 624, 639

[56] References Cited

U.S. PATENT DOCUMENTS

| | | | |
|---|---|---|---|
| 5,828,096 | 10/1998 | Ohno et al. | 257/306 |
| 5,846,873 | 12/1998 | Violette et al. | 438/585 |
| 5,847,465 | 12/1998 | Liou et al. | 257/774 |

FOREIGN PATENT DOCUMENTS

| | | |
|---|---|---|
| 2-285658 | 11/1990 | Japan . |
| 9-162388 | 6/1997 | Japan . |
| 9-246486 | 9/1997 | Japan . |

*Primary Examiner*—Charles Bowers
*Assistant Examiner*—William M. Brewster
*Attorney, Agent, or Firm*—Scully, Scott, Murphy & Presser

[57] ABSTRACT

A semiconductor device that prevents any problems relating to contact resistance increase at a conductor plug and parasitic resistance increase near the conductor plug. A first patterned conductive layer is formed on a first dielectric layer, and a second patterned dielectric layer is formed on the first patterned conductive layer. A third dielectric layer is formed on the first dielectric layer to cover entirely the first patterned conductive layer and covering partially the second patterned dielectric layer. A fourth patterned dielectric layer is formed on the third dielectric layer to serve as sidewall spacers for the part the second patterned dielectric layer exposed from the third dielectric layer. A fifth dielectric layer is formed on the third dielectric layer. A contact hole is formed to penetrate through at least the fifth and third dielectric layers. A conductive plug is formed to fill the contact hole. A second conductive layer is formed on the fifth dielectric layer to be contacted with the conductive plug. The conductive plug is electrically insulated from the first patterned conductive layer by the third dielectric layer itself in the contact hole. The second conductive layer is electrically connected with the substrate or a conductive layer intervening between the substrate and the third dielectric layer.

5 Claims, 9 Drawing Sheets

METHOD OF FORMING A SEMICONDUCTOR DEVICE WITH A CONDUCTOR PLUG INCLUDING FIVE DIELECTRIC LAYERS, THE FOURTH DIELECTRIC LAYER FORMING SIDEWALL SPACERS

BACKGROUND OF THE INVENTION

1. Field of the Invention

The present invention relates to a semiconductor device and a fabrication method thereof and more particularly, to a semiconductor device having a conductor plug formed in a contact hole of an interlayer dielectric layer, which is applicable to a Metal-Oxide-Semiconductor Field-Effect Transistor (MOSFET) or semiconductor memory device using MOSFETs, and a fabrication method of the device.

2. Description of the Prior Art

In recent years, the integration and miniaturization level of memory cells of semiconductor memory devices has been increasingly progressing. In response to this trend, there has been the strong need to improve the pattern-to-pattern or mask-to-mask overlay accuracy for patterned semiconductor, dielectric, and metal layers constituting the semiconductor memory devices. At the same time as this, permissible pattern-to-pattern or mask-to-mask alignment margins have been increasingly reduced. As a result, to cope with the above trend, conventionally, reconsideration of the structure and fabrication processes of the electronic elements or components constituting the semiconductor memory devices has been being carried out.

For example, with a MOS semiconductor memory device using MOSFETs, source/drain regions formed in a semiconductor substrate and wiring layers formed over the source/drain regions through an interlayer dielectric layer are electrically connected with each other by conductive members termed "contact plugs" or "conductor plugs" formed to vertically penetrate through the interlayer dielectric layer. The contact or conductor plugs are located in contact holes that are formed to penetrate vertically the interlayer dielectric layer and to interconnect the underlying source/drain regions with the overlying wiring layers.

The reduction of the pattern-to-pattern or mask-to-mask alignment margin will increase the danger that electrical short-circuit takes place between the wiring layers and the source/drain regions due to the conductor plugs. In other words, if the placement or overlay error of the masks or patterns in the fabrication processes is greater than a specific limit, electrical short-circuit between the wiring layers and the source/drain regions tends to frequently occur. This situation will degrade drastically the fabrication yield and reliability of the semiconductor memory devices.

To present the above-described problem relating short-circuit from occurring, conventionally, various improvements have been researched and developed.

FIGS. 1A to 1D show a conventional fabrication method of a semiconductor device, which was developed to solve the above problem and disclosed in the Japanese Non-Examined Patent Publication No. 2-285658 published in 1990.

Actually, a lot of source/drain regions are formed in a single-crystal silicon (Si) substrate and therefore, a lot of gate electrodes and a lot of contact holes are formed over the substrate. However, for the sake of simplification of description, one of the source/drain regions, one of the contact holes, one of the contact plugs, and two ones of the gate electrodes are only shown in FIGS. 1A to 1D and explained below.

First, as shown in FIG. 1A, a single-crystal Si substrate 101 having a source/drain region 101a in its surface area is prepared. Then, a silicon dioxide ($SiO_2$) layer 102 serving as an interlayer dielectric layer is formed on the surface of the substrate 101. A conductive layer (not shown) is formed on the $SiO_2$ layer 102 and patterned, thereby forming two gate electrodes 105 of MOSFETs on the $SiO_2$ layer 102 so as to locate the source/drain region 101a between the gate electrodes 105. The gate electrodes 105 run along the surface of the substrate 101, which extend vertically with respect to the paper. Parts of the $SiO_2$ layer 102 just below the gate electrodes 105 serve as gate insulators of the MOSFETs. The state at this stage is shown in FIG. 1A.

Subsequently, as shown in FIG. 1B, a Boron-doped PhosphorSilicate Glass (BPSG) layer 108 is deposited on the $SiO_2$ layer 102 as an interlayer dielectric layer covering the gate electrodes 105. Then, using a patterned photoresist film (not shown) by a photolithography technique, the BPSG layer 108 and the underlying $SiO_2$ layer 102 are selectively etched to form a contact hole 109 uncovering the surface of the substrate 101 between the adjoining gate electrodes 105. The contact hole 109 has, for example, a rectangular or circular plan shape. The bottom of the contact hole 109 reaches the underlying source/drain region 101a.

In FIG. 1B, the contact hole 109 deviates laterally from its desired or correct position to the left-hand side. At the desired or correct position, the contact hole 109 is apart from the adjoining two gate electrodes 105 and located in the middle of the source/drain region 101a.

A dielectric layer (not shown) made of $SiO_2$ or silicon nitride ($Si_3N_4$) is deposited on the BPSG layer 108 and is etched back, thereby selectively leaving the dielectric layer in the contact hole 109. Thus, a pair of sidewall spacers 103 are formed at opposing inner sides of the contact hole 109, as shown in FIG. 1C. The pair of sidewall spacers 103 serve to prevent a contact plug to be filled in the hole 109 in later process steps from being contacted with the gate electrodes 105.

Next, a polysilicon layer (not shown) is deposited on the BPSG layer 108. The thickness of the polysilicon layer is determined so that the polysilicon layer fills the contact hole 109. The polysilicon layer is then etched back until the surface of the underlying BPSG layer 108 is exposed, thereby selectively leaving the polysilicon layer thus deposited only in the contact hole 109. Thus, a contact plug 110 is formed in the contact hole 109 by the remaining polysilicon layer, as shown in FIG. 1D. The bottom of the plug 110 is contacted with the source/drain region 101a of the substrate 101. The opposite sides of the plug 110 are apart from the corresponding gate electrodes 105 by the sidewall spacers 103.

Thereafter, as shown in FIG. 1D, a conductive layer (not shown) is formed on the BPSG layer 108 and is patterned to have a specific plan shape, resulting in a wiring layer 111 on the BPSG layer 108. The bottom surface of the wiring layer 111 is contacted with the top of the contact plug 110.

Through the above-described process steps, the wiring layer 111 is electrically connected to the source/drain region 101a of the substrate 101 through the polysilicon plug 110. Typically, the wiring layer 111 serves as bit lines of a MOS semiconductor memory device.

With the conventional fabrication method of a semiconductor device shown in FIGS. 1A to 1D, the above-described problem of the electrical short-circuit can be solved.

However, after the contact hole 109 is formed to penetrate the BPSG layer 108 and the $SiO_2$ layer 102, the sidewall spacers 103 are formed within the contact hole 109. Thus, the effective or available size of the contact hole 109 is decreased due to existence of the sidewall spacers 103, raising another problem that the contact resistance at the contact plug 110 is increased.

FIGS. 2A to 2D show another conventional fabrication method of a semiconductor device, which was developed to solve the above problem of the electrical short-circuit.

First, as shown in FIG. 2A, after a single-crystal Si substrate 201 having a source/drain region 201a in its surface area is prepared, a $SiO_2$ layer 202 serving as an interlayer dielectric layer is formed on the surface of the substrate 201. A conductive layer (not shown) is then deposited on the $SiO_2$ layer 202 and a $Si_3N_4$ layer (not shown) is deposited on the conductive layer thus deposited. The $Si_3N_4$ layer and the conductive layer are patterned to have a same specific shape, thereby forming gate electrodes 205 made of the conductive layer and dielectric caps 204 made of the $Si_3N_4$ layer on the $SiO_2$ layer 202. The dielectric caps 204 are located on the gate electrodes 205. Parts of the $SiO_2$ layer 202 just below the gate electrodes 205 serve as gate insulators.

Subsequently, as shown in FIG. 2B, a $Si_3N_4$ layer (not shown) is formed on the $SiO_2$ layer 202 to cover the gate electrodes 205 and the dielectric caps 204. The $Si_3N_4$ layer is then etched back to be selectively left at both sides of the gate electrodes 205 and the caps 204. Thus, two pairs of sidewall spacers 207 are formed on the $SiO_2$ layer 202. Each of the pair of sidewall spacers are located at two opposite sides of a corresponding one of the gate electrodes 205 and a corresponding one of the caps 204, as shown in FIG. 2B.

At this stage, the top face of each gate electrode 205 is covered with the $Si_3N_4$ cap 204 and the two side faces thereof are covered with the pair of $Si_3N_4$ sidewall spacers 207, as shown in FIG. 2B.

Following this, as shown in FIG. 2C, a BPSG layer 208 is deposited on the $SiO_2$ layer 202 as an interlayer dielectric layer covering the gate electrodes 205 and the dielectric caps 204. Then, using a patterned photoresist film (not shown) by a photolithography technique, the BPSG layer 208 and the underlying $SiO_2$ layer 202 are selectively etched to form a contact hole 209 uncovering the surface of the substrate 201 between the two adjoining gate electrodes 205. The contact hole 209 has, for example, a rectangular or circular plan shape. The bottom of the contact hole 209 reaches the underlying source/drain region 201a.

In FIG. 2C, like FIG. 1B, the contact hole 209 deviates laterally from its desired or correct position to the left-hand side. At the desired or correct position, the contact hole 209 is apart from the gate electrodes 205 and located in the middle of the source/drain region 201a.

To prevent or suppress undesired etching of the $Si_3N_3$ caps 204 and the $Si_3N_4$ sidewall spacers 207, the etching process for the BPSG layer 108 and the $SiO_2$ layer 202 is carried out under the condition that the etch rate of BPSG and $SiO_2$ is sufficiently higher than that of $Si_3N_4$.

A polysilicon layer (not shown) is then deposited on the BPSG layer 208, in which the thickness of the polysilicon layer is determined to fill the whole contact hole 209. The polysilicon layer is etched back until the surface of the BPSG layer 208 is exposed, thereby selectively leaving the polysilicon layer only in the contact hole 209. Thus, a contact plug 210 made of polysilicon is formed in the contact hole 209, as shown in FIG. 2D. The bottom of the plug 210 is contacted with the source/drain region 201a of the substrate 201.

Thereafter, as shown in FIG. 2D, a conductive layer (not shown) is formed on the BPSG layer 208 and is patterned to have a specific plan shape, resulting in a wiring layer 211 on the BPSG layer 208. The bottom of the wiring layer 211 is contacted with the top of the contact plug 210.

Through the above-described process steps, the wiring layer 211 is electrically connected to the source/drain region 201a of the substrate 201 through the polysilicon plug 210. Typically, the wiring layer 211 serves as bit lines of a semiconductor memory device.

With the conventional method shown in FIGS. 2A to 2D, unlike the conventional method shown in FIGS. 1A to 1D, each gate electrode 205 is covered with the dielectric caps 204 and the sidewall spacers 207 and therefore, the gate electrodes 205 are difficult to be exposed during the etching process for the contact hole 209. This means that the above-described problem of the electrical short-circuit can be solved.

However, the whole top face of each gate electrode 205 is covered with the dielectric cap 204 and the whole side faces thereof are covered with the dielectric sidewall spacers 207, where the caps 204 and the sidewall spacers 207 are made of $Si_3N_4$ having a high dielectric constant. As a result, there is another problem that a parasitic capacitance due to the gate electrodes 205 and the wiring layer 211 becomes high.

Other conventional methods of this sort are disclosed in the Japanese Non-Examined Patent Publication Nos. 9-162388 and 9-246486 both of which were published in 1997.

In the conventional method disclosed in the Japanese Non-Examined Patent Publication No. 9-162388, after a gate electrode and dielectric sidewall spacers located at each side of the gate electrode are formed, a first dielectric layer is formed to cover the gate electrode and the sidewall spacers. Next, a second dielectric layer is formed on the first dielectric layer. The second dielectric layer is selectively etched to be removed from the bottom of the gate electrode to half of the height of the gate electrode, thereby forming a cap-shaped structure of the gate electrode while the lower half of the first dielectric layer is exposed from the second dielectric layer.

Thus, with the conventional method disclosed in the Japanese Non-Examined Patent Publication No. 9-162388, when a contact hole reaching an underlying source/drain region is formed by etching in an interlayer dielectric layer to be formed to cover the gate electrode, the second dielectric layer serves as an etch stop. Therefore, the gate electrode is prevented from being exposed in the etching process of the contact hole, resulting in prevention of the electric short-circuit problem between the gate electrode and the source/drain region.

However, the gate electrode and the sidewall spacers are entirely covered with the first dielectric layer and the upper half parts of the gate electrode and the sidewall spacers are further covered with the second dielectric layer. Accordingly, like the conventional method shown in FIGS. 2A to 2D, there is a problem that a parasitic capacitance due to the gate electrode and its adjoining wiring layer or layers becomes high.

In the conventional method disclosed in the Japanese Non-Examined Patent Publication No. 9-246486, after a dielectric layer is formed on a conductive layer, the dielectric layer is patterned to form an upper dielectric layer (i.e., cap layer) covering the top of a gate electrode. Then, using the upper dielectric layer as a mask, the conductive layer is patterned to form the gate electrode. Both sides of the gate electrode are then etched to make the width of the gate electrode smaller than that of the upper dielectric layer. Thereafter, dielectric sidewall spacers are formed at each side of the gate electrode.

Thus, with the conventional method disclosed in the Japanese Non-Examined Patent Publication No. 9-246486, after decreasing the width of the gate electrode by etching to make the width of the gate electrode smaller than that of the upper dielectric layer, the dielectric sidewall spacers are formed at each side of the gate electrode. Therefore, even if the thickness of the sidewall spacers is decreased, the above-described electric short-circuit problem between the gate electrode and the source/drain region is prevented from occurring.

However, the upper face of the gate electrode is entirely covered with the upper dielectric layer and the side faces of the gate electrode are entirely covered with the sidewall spacers. Thus, like the conventional method shown in FIGS. 2A to 2D, there is another problem that a parasitic capacitance due to the gate electrode and its adjoining wiring layer or layers become high.

SUMMARY OF THE INVENTION

Accordingly, an object of the present invention to provide a semiconductor device and a fabrication method thereof that prevents any problems relating to contact resistance increase at a conductor plug and parasitic resistance increase near the conductor plug.

Another object of the present invention to provide a semiconductor device and a fabrication method thereof that makes it possible to form a contact hole in a dielectric layer in self-alignment to a corresponding conductive member while preventing electrical short-circuit through a conductor plug formed in the contact hole.

The above objects together with others not specifically mentioned will become clear to those skilled in the art from the following description.

According to a first aspect of the present invention, a semiconductor device is provided, which is comprised of (a) a first dielectric layer formed directly on or indirectly over a semiconductor substrate through a layer; (b) a first patterned conductive layer formed on the first dielectric layer; (c) a second patterned dielectric layer formed on the first patterned conductive layer; the second patterned dielectric layer having approximately a same plan shape as that of the first patterned conductive layer; (d) a third dielectric layer formed on the first dielectric layer; the third dielectric layer serving as an interlayer dielectric layer covering entirely the first patterned conductive layer and covering partially the second patterned dielectric layer; part of the second patterned dielectric layer being exposed from the third dielectric layer; (e) a fourth patterned dielectric layer formed on the third dielectric layer; the fourth patterned dielectric layer serving as sidewall spacers for the part of the second patterned dielectric layer exposed from the third dielectric layer; (f) a fifth dielectric layer formed on the third dielectric layer; the fifth dielectric layer serving as an interlayer dielectric layer covering the part of the second patterned dielectric layer exposed from the third dielectric layer and the fourth patterned dielectric layer; (g) a contact hole formed to penetrate through at least the fifth and third dielectric layers; (h) a conductive plug filled in the contact hole; (i) a second conductive layer formed on the fifth dielectric layer; the second conductive layer being contacted with the conductive plug; (j) the conductive plug being electrically insulated from the first patterned conductive layer by the third dielectric layer itself in the contact hole; and (k) the second conductive layer being electrically connected with a region of the substrate or a conductive layer located between the substrate and the first dielectric layer through the conductive plug.

With the semiconductor device according to the first aspect of the present invention, the first patterned conductive layer is formed on the first dielectric layer and at the same time, the second patterned dielectric layer having approximately the same plan shape as that of the first patterned conductive layer is formed on the first patterned conductive layer. The first patterned conductive layer is entirely covered with the third dielectric layer serving as an interlayer dielectric layer while the part of the second patterned dielectric layer is exposed from the third dielectric layer. Moreover, the fourth patterned dielectric layer forms the sidewall spacers for the part of the second dielectric layer exposed from the third dielectric layer.

Thus, the first patterned conductive layer is covered with only the third dielectric layer serving as an interlayer dielectric layer. As a result, even if the second patterned dielectric layer is made of a dielectric material with a high dielectric constant, the parasitic capacitance caused by the first and second conductive layers is suppressed by using a dielectric material with a low dielectric constant for the third dielectric layer.

Also, since the conductive plug is electrically insulated from the first patterned conductive layer by the third dielectric layer itself, no dielectric sidewall spacers are required to be formed in the contact hole for electrical insulation between the conductive plug and the first patterned conductive layer. Thus, there is no danger that the contact resistance becomes high due to decrease in effective or available size of the contact hole.

Moreover, the top face of the first patterned conductive layer is covered with the second patterned dielectric layer having approximately the same plan shape as that of the first patterned conductive layer. The side faces of the first patterned conductive layer are covered with the sidewall spacers formed by the fourth patterned dielectric layer. Thus, there is no danger that the first patterned conductive layer is exposed in the process of forming the contact hole such as an etching process. As a result, the contact hole can be formed in self-alignment to the second and fourth patterned dielectric layers (i.e., the first patterned conductive layer) while preventing the electrical short-circuit through the conductive plug filled in the contact hole.

In a preferred embodiment of the device according to the first aspect, the second patterned dielectric layer is made of silicon nitride. In this embodiment, there is an additional advantage that the protection of the first conductive layer in the process of forming the contact hole is ensured still more.

In another preferred embodiment of the device according to the first aspect, the second patterned dielectric layer has a two-layer structure comprising a silicon nitride sublayer and a silicon oxide sublayer. The silicon oxide sublayer is located between the silicon nitride sublayer and the first patterned conductive layer. In this embodiment, there is an additional advantage that not only the protection of the first patterned conductive layer in the process of forming the contact hole is ensured still more but also the parasitic capacitance is further lowered.

In still another preferred embodiment of the device according to the first aspect, the fourth dielectric layer is made of silicon nitride. In this embodiment, there is an additional advantage that the protection of the first patterned conductive layer in the process of forming the contact hole is ensured still more.

According to a second aspect of the present invention, a fabrication method of a semiconductor device is provided, which is comprised of the following steps (a) to (h).

In the step (a), a structure is formed to include a first dielectric layer formed directly on or indirectly over a semiconductor substrate through a layer; a first patterned conductive layer formed on the first dielectric layer; a second patterned dielectric layer formed on the first patterned conductive layer; and the second dielectric layer having approximately a same plan shape as that of the first patterned conductive layer.

In the step (b), a third dielectric layer is formed on the first dielectric layer. The third dielectric layer serves as an interlayer dielectric layer covering entirely the first patterned conductive layer and covering partially the second patterned dielectric layer. Part of the second patterned dielectric layer is exposed from the third dielectric layer.

In the step (c), a fourth dielectric layer is formed on the third dielectric layer. The fourth dielectric layer covers the part of the second patterned dielectric layer exposed from the third dielectric layer.

In the step (d), the fourth dielectric layer is patterned to form sidewall spacers for the part of the second patterned dielectric layer exposed from the third dielectric layer.

In the step (e), a fifth dielectric layer is formed on the third dielectric layer. The fifth dielectric layer serves as an interlayer dielectric layer covering the part of the second dielectric layer exposed from the third dielectric layer and the fourth patterned dielectric layer.

In the step (f), a contact hole is formed to penetrate through at least the fifth and third dielectric layers.

In the step (g), a conductive plug is formed to fill the contact hole. The plug is contacted with a region of the substrate or a conductive layer located between the substrate and the first dielectric layer. The plug is electrically insulated from the first patterned conductive layer by the third dielectric layer itself in the contact hole.

In the step (a), a second conductive layer is formed on the fifth dielectric layer. The second conductive layer is contacted with the conductive plug. The second conductive layer is electrically connected with the region of the substrate or the conductive layer located between the substrate and the first dielectric layer through the conductive plug.

With the fabrication method of a semiconductor device according to the second aspect of the present invention, similar to the semiconductor device according to the first aspect, the first patterned conductive layer is formed on the first dielectric layer, and the second patterned dielectric layer having approximately the same plan shape as that of the first patterned conductive layer is formed on the first patterned conductive layer in the step (a). The third dielectric layer is formed as an interlayer dielectric layer to cover entirely the first patterned conductive layer and covering partially the second patterned dielectric layer in the step (b), where the part of the second patterned dielectric layer is exposed from the third dielectric layer. Further, in the steps (c) and (d), the fourth dielectric layer is formed to cover the part of the second patterned dielectric layer exposed from the third dielectric layer and then, the fourth dielectric layer is patterned, thereby forming the sidewall spacers for the part of the second patterned dielectric layer exposed from the third dielectric layer.

Thus, the first patterned conductive layer is covered with only the third dielectric layer serving as an interlayer dielectric layer. As a result, even if the second patterned dielectric layer is made of a dielectric material with a high dielectric constant, the parasitic capacitance caused by the first and second conductive layers is suppressed by using a dielectric material with a low dielectric constant for the third dielectric layer.

Also, since the conductive plug is electrically insulated from the first patterned conductive layer by the third dielectric layer itself, no dielectric sidewall spacers are required to be formed in the contact hole for electrical insulation between the conductive plug and the first patterned conductive layer. Thus, there is no danger that the contact resistance becomes high due to decrease in effective or available size of the contact hole.

Moreover, the top face of the first patterned conductive layer is covered with the second patterned dielectric layer having approximately the same plan shape as that of the first patterned conductive layer. The side faces of the first patterned conductive layer are covered with the sidewall spacers formed by the fourth patterned dielectric layer. Thus, there is no danger that the first patterned conductive layer is exposed from the third dielectric layer in the step (f) of forming the contact hole. As a result, the contact hole can be formed in self-alignment to the second and fourth patterned dielectric layers (i.e., the first patterned conductive layer) while preventing the electrical short-circuit through the conductive plug filled in the contact hole.

In a preferred embodiment of the method according to the second aspect; the second patterned dielectric layer is made of silicon nitride. In this embodiment, there is an additional advantage that the protection of the first patterned conductive layer in the step (f) of forming the contact hole is ensured still more.

In another preferred embodiment of the method according to the second aspect, the second patterned dielectric layer has a two-layer structure comprising a silicon nitride sublayer and a silicon oxide sublayer. The silicon oxide sublayer is located between the silicon nitride sublayer and the first conductive layer. In this embodiment, there is an additional advantage that not only the protection of the first patterned conductive layer in the step (f) of forming the contact hole is ensured still more but also the parasitic capacitance is further lowered.

In still another preferred embodiment of the method according to the second aspect, the fourth dielectric layer is made of silicon nitride. In this embodiment, there is an additional advantage that the protection of the first conductive layer in the step (f) of forming the contact hole is ensured still more.

In a further preferred embodiment of the method according to the second aspect, the step (b) of forming the third dielectric layer is comprised of a first substep (b-1) of forming a base dielectric layer on the first dielectric layer to entirely cover both the first patterned conductive layer and the third dielectric layer; a second substep (b-2) of planarizing a surface of the base dielectric layer; and a third substep (b-3) of etching back the planarized surface of the base dielectric layer to expose at least part of the second patterned dielectric layer. In this embodiment, there is an additional advantage that the third dielectric layer can be readily formed to expose at least part of the second patterned dielectric layer from the third dielectric layer.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1A:
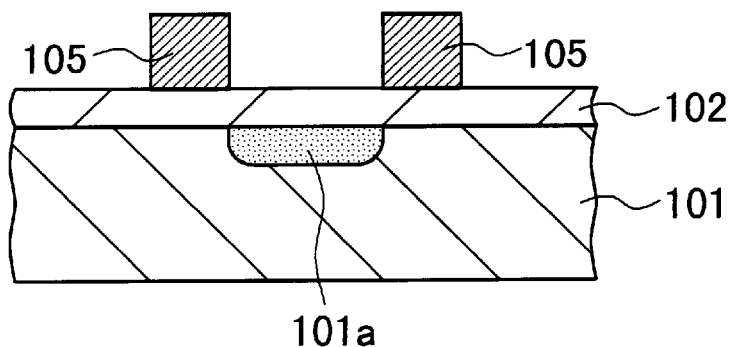
FIGS. 1A to 1D are partial cross-sectional views showing a conventional fabrication method of a semiconductor device, respectively.
Figure 1B:
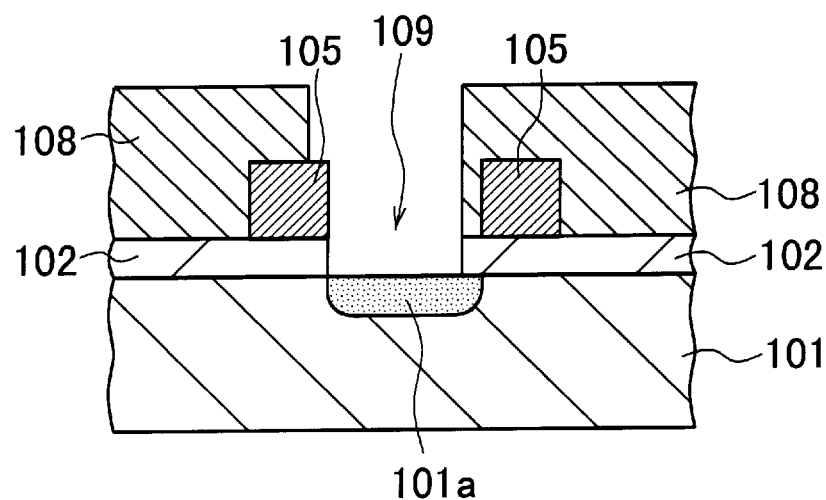
Figure 1C:
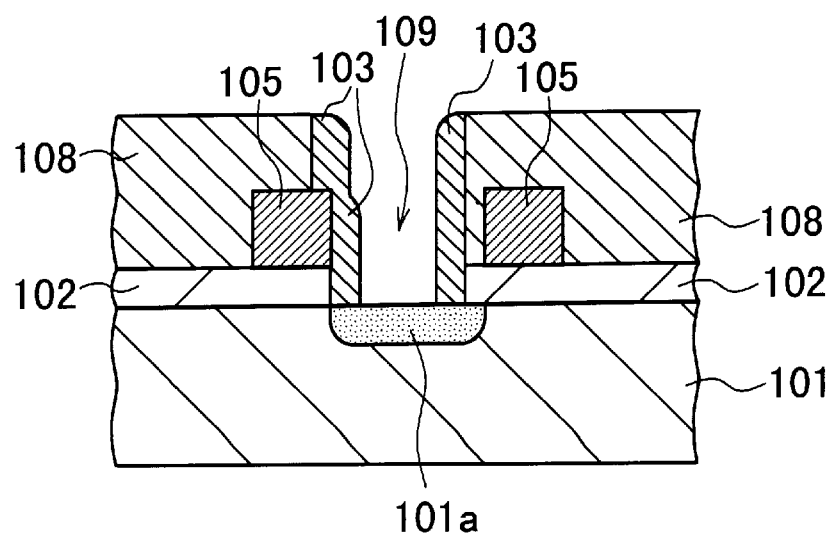
Figure 1D:
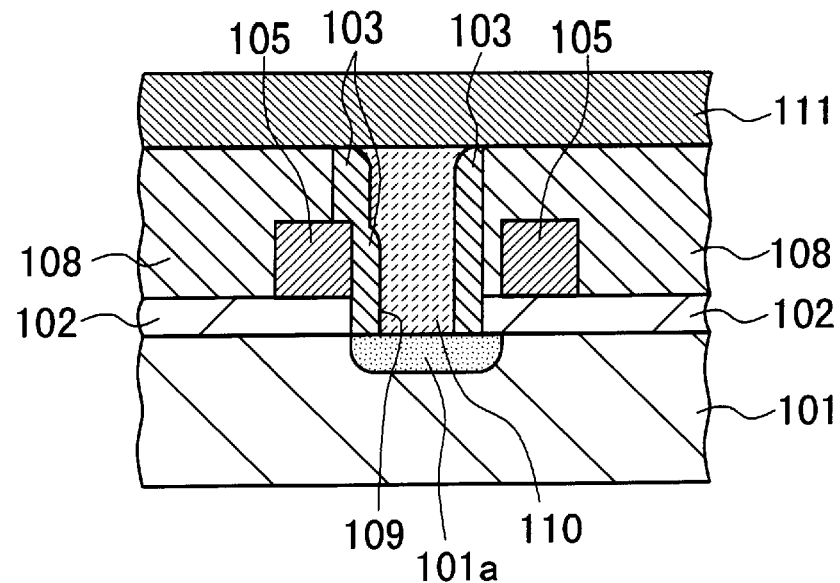
Figure 2A:
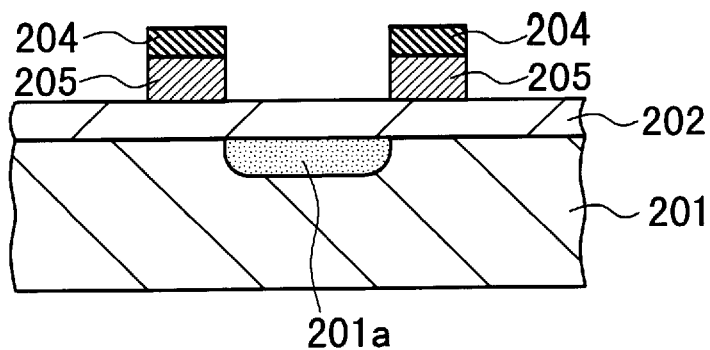
FIGS. 2A to 2D are partial cross-sectional views showing another conventional fabrication method of a semiconductor device, respectively.
Figure 2B:
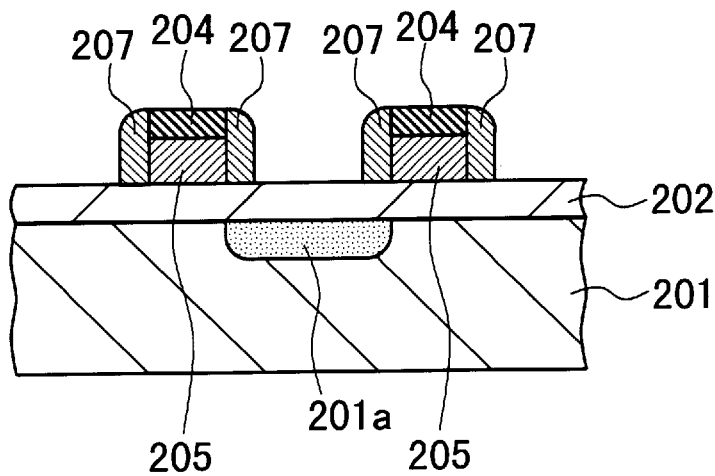
Figure 2C:
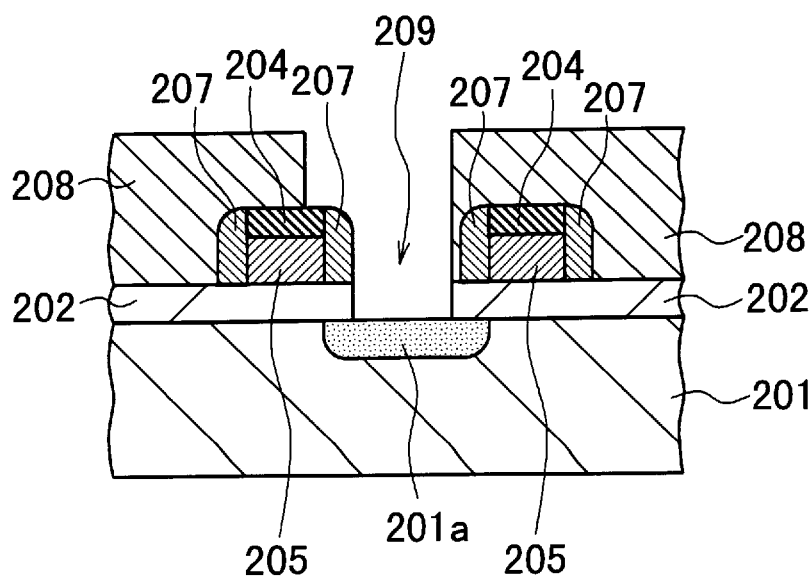
Figure 2D:
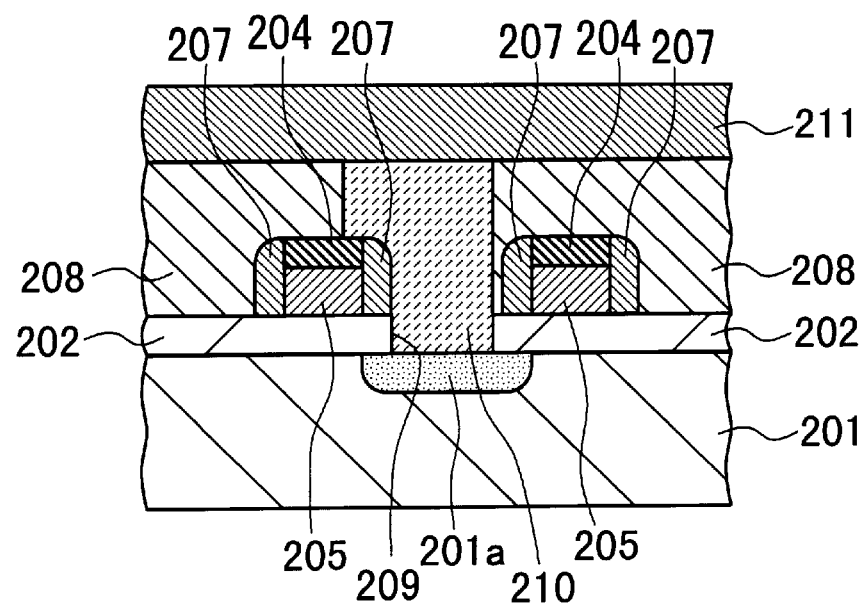

Preferred embodiments of the present invention will be described in detail below while referring to the drawings attached.

FIRST EMBODIMENT

A fabrication method of a semiconductor device according to a first embodiment of the present invention is explained below with reference to FIGS. 3A to 3E.

In FIGS. 3A to 3E, a lot of source/drain regions are formed in a single-crystal Si substrate and therefore, a lot of wiring lines that may serve as gate electrodes, and a lot of contact holes are formed on the substrate. However, for the sake of simplification of description, one of the source/drain regions, one of the contact holes, one of the contact plugs, and two ones of the wiring lines are shown in FIGS. 3A to 3E and explained below.

Figure 3A:
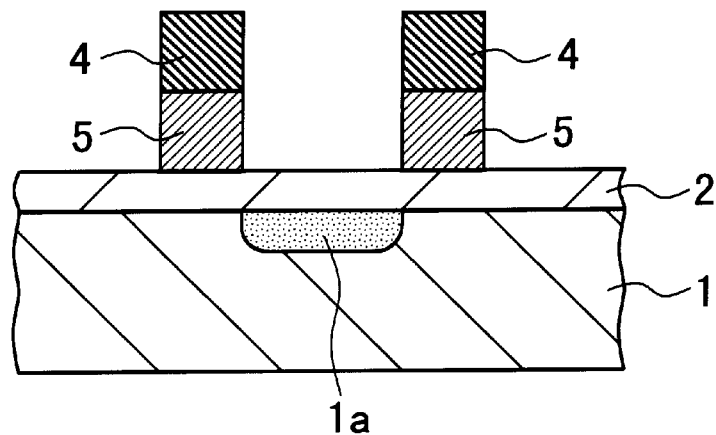
FIGS. 3A to 3D are partial cross-sectional views showing a fabrication method of a semiconductor device according to a first embodiment of the present invention, respectively.

First, as shown in FIG. 3A, a single-crystal Si substrate 1 having a source/drain region 1a in its surface area is prepared. Then, a $SiO_2$ layer 2 is formed on the surface of the substrate 1 by a thermal oxidation process or the like.

Next, a polysilicon layer (not shown) with a thickness of 200 nm is formed on the $SiO_2$ layer 2 by a Chemical Vapor Deposition (CVD) process. A $Si_3N_4$ layer (not shown) with a thickness of 200 nm is formed by a CVD process on the polysilicon layer thus deposited. Thereafter, the polysilicon layer and the $Si_3N_4$ layer are patterned to have a same specific plan shape by known photolithography and etching techniques, thereby forming polysilicon wiring lines 5 located on the $SiO_5$ layer 2 and $Si_3N_4$ caps 4 located on the respective wiring lines 5, as shown in FIG. 3A.

Figure 4:
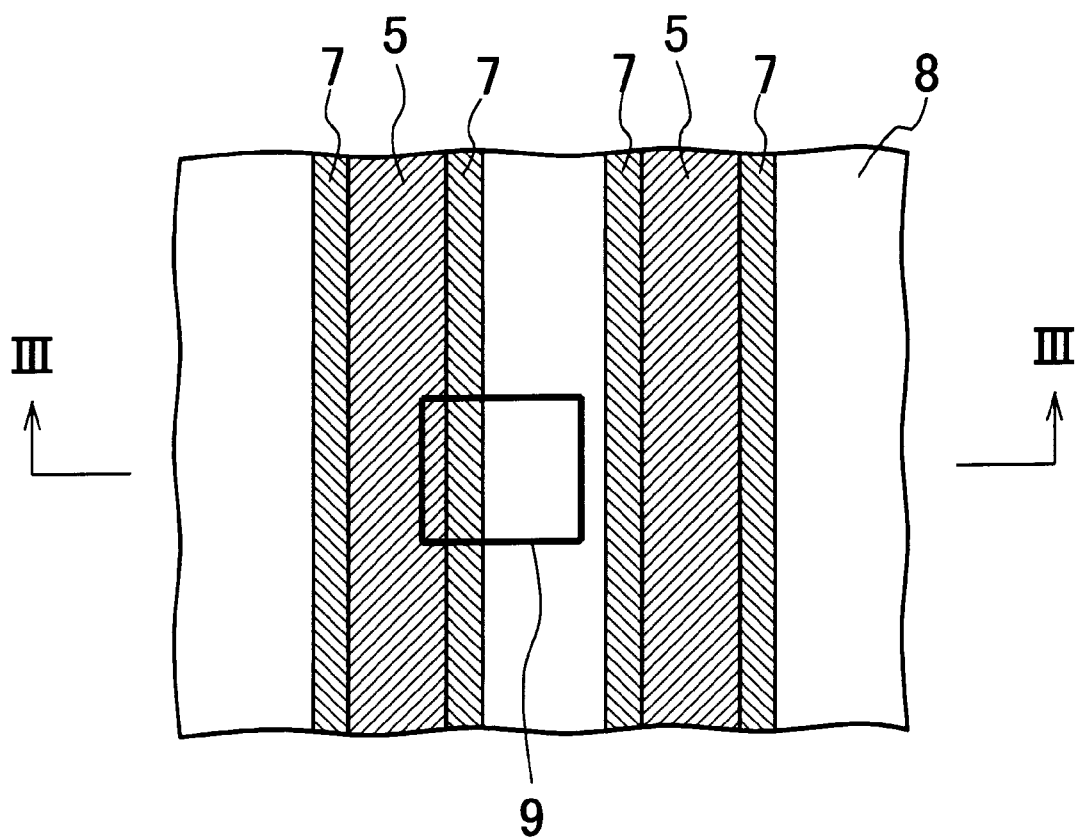
FIG. 4 is a partial plan view showing the fabrication method according to the first embodiment of FIGS. 3A to 3D.

As shown in FIG. 4, the wiring lines 5 extend in parallel to one another along the surface of the substrate 1.

The polysilicon layer and the $Si_3N_4$ layer may be etched successively using a same mask. Alternately, the upper $Si_3N_4$ layer is etched using a mask and then, the lower polysilicon layer may be etched using the patterned or etched $Si_3N_4$ layer itself as a mask. Any other process or processes may be used for this purpose if the tops of the wiring lines 5 are covered with the dielectric caps 4.

The location of the wiring lines 5 and the dielectric caps 4 is determined so that the source/drain region 1a intervenes between the two adjoining wiring lines 5.

Subsequently, a BPSG layer 6 with a thickness of 600 nm is deposited by a CVD process on the $SiO_2$ layer 2 to cover the wiring lines 5 and the dielectric caps 4. Since the BPSG layer 6 has protrusions due to existence of the wiring lines 5 and the dielectric caps 4 at this step, the surface of the BPSG layer 6 is planarized by a reflow process of heating the BPSG layer 6 in a nitrogen ($N_2$) atmosphere or a Chemical Mechanical Polishing (CMP) process.

Figure 3B:
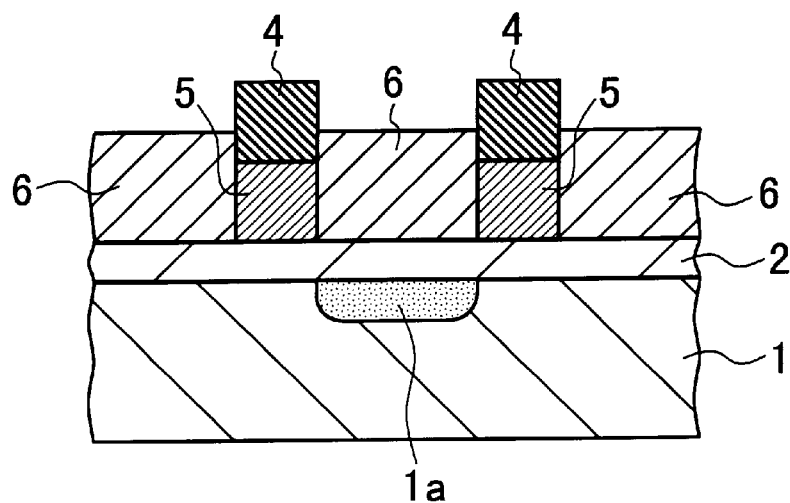

Following this step, the BPSG layer 6 is etched back by a wet etching process using a hydrogen fluoride (HF) solution of a dry etching process, thereby exposing the upper parts of the caps 4 from the BPSG layer 6, as shown in FIG. 3B. Since the surface of the BPSG layer 6 has been planarized, the thickness of the layer 6 is uniformly decreased by the etch pack process, resulting in exposure or protrusion of the upper parts of the caps 4. The degree of exposure or protrusion of the caps 4 are determined, for example, in such a way that the exposed or protruded parts of the caps 4 have a thickness or height of approximately 200 nm, which is approximately equal to half of the thickness of the caps 4. The state at this stage is shown in FIG. 3B.

Further, a $Si_3N_4$ layer (not shown) with a thickness of 100 nm is deposited by a CVD process on the remaining BPSG layer 6 and then, the $Si_3N_4$ layer is etched back by an anisotropic etching process. Since the $Si_3N_4$ layer has protrusions due to existence of the protruding dielectric caps 4 from the BPSG layer 6, the $Si_3N_4$ layer is selectively left only at two opposite sides of the dielectric caps 4. Thus, sidewall spacers 7 made of $Si_3N_4$ are formed on the BPSG layer 6, as shown in FIG. 3C.

Figure 3C:
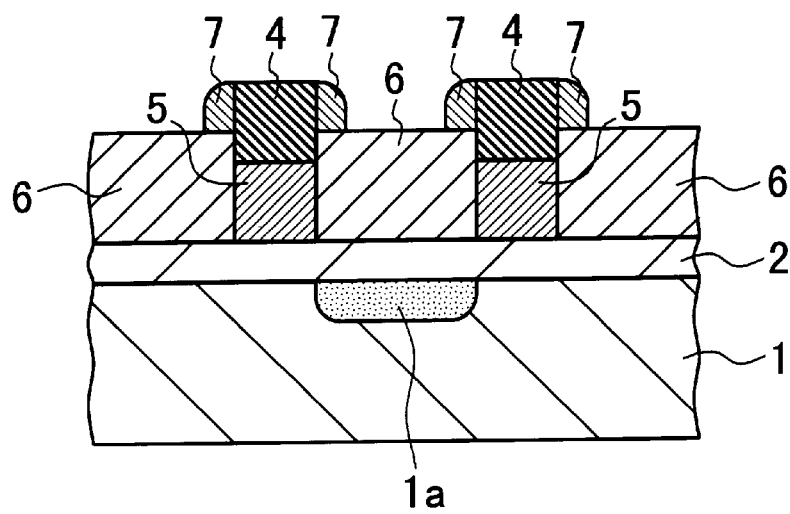

In the state shown in FIG. 3C, the top faces of the wiring lines 5 are covered with the $Si_3N_4$ caps 4 and the side faces thereof are covered with the BPSG layer 6. The $Si_3N_4$ sidewall spacers 7 cover only the corresponding side faces of the caps 4. The sidewall spacers 7 are apart from the wiring lines 5.

Figure 3D:
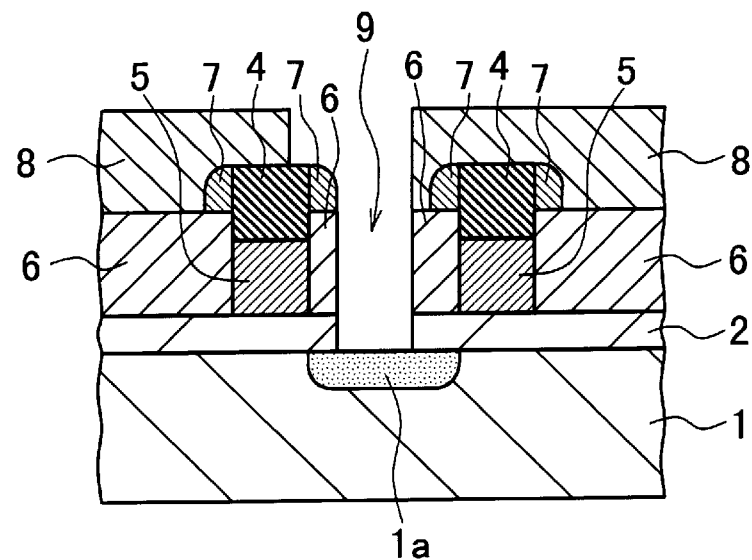

Subsequently, as shown in FIG. 3D, a BPSG layer 8 is deposited by a CVD process or the like on the remaining BPSG layer 6 as an interlayer dielectric layer covering the wiring lines 5, the dielectric caps 4, and the dielectric sidewall spacers 7. Since the BPSG layer 8 has protrusions due to existence of the protruding caps 4 and the spacers 7 at this step, the surface of the BPSG layer 7 is planarized by a CMP process or the like.

Using a patterned photoresist film (not shown) by a photolithography technique as a mask, the BPSG layer 8 and the underlying $SiO_2$ layer 2 are selectively etched, thereby forming a contact hole 9, as shown in FIG. 3D. The contact hole 9 has a rectangular or circular plan shape, for example. The bottom of the hole 9 reaches the underlying source/drain region 1a of the substrate 1.

In FIG. 3D, the contact hole 9 deviates laterally from its desired or correct position to the left-hand side. At the desired or correct position, the contact hole 9 is apart from the two adjoining wiring lines 5 and located in the middle of the source/drain region 1a.

To prevent or suppress the etching of the $Si_3N_4$ caps 4 and the $Si_3N_4$ sidewall spacers 7, the etching for the BPSG layer 8 and the $SiO_2$ layer 2 is carried out under the condition that the etch rate of BPSG and $SiO_2$ is sufficiently higher than that of $Si_3N_4$. For example, the BPSG layer 8 and the $SiO_2$ layer 2 are etched by a dry etching process using a gaseous mixture of $CHF_3$ and CO.

Figure 3E:
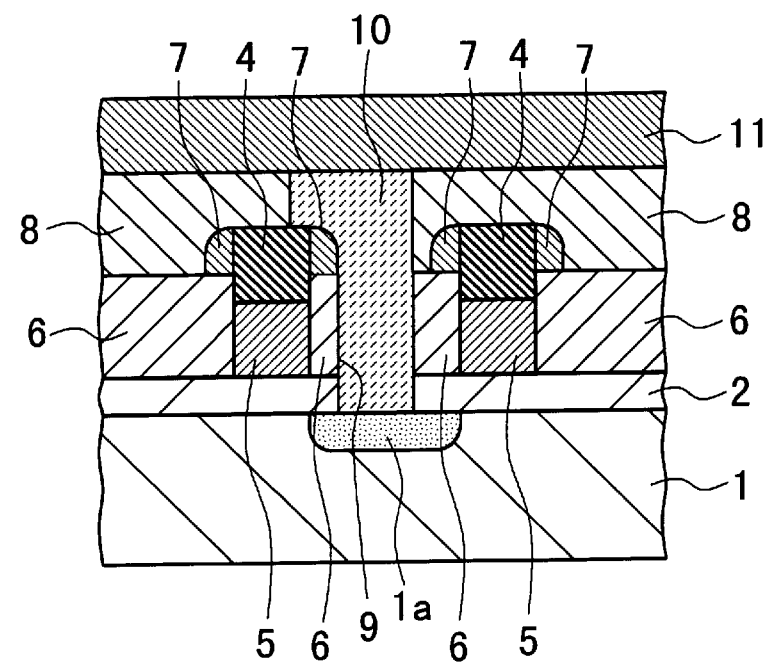

Then, a polysilicon layer (not shown) is deposited on the BPSG layer 8, in which the thickness of the polysilicon layer is determined to fill the whole contact hole 9. The polysilicon layer is etched back until the surface of the underlying BPSG layer 8 is exposed, thereby selectively leaving the polysilicon layer only in the contact hole 9. Thus, a conductive plug or contact plug 10 made of polysilicon is formed in the contact hole 9, as shown in FIG. 3E. The bottom of the plug 10 is contacted with the source/drain region 1a of the substrate 1.

Thereafter, as shown in FIG. 3E, a conductive layer (not shown) is formed on the BPSG layer 8 and is patterned to have a specific pattern, resulting in a wiring layer 11. The conductive layer is typically made of polysilicon or metal. The bottom of the wiring layer 11 is contacted with the top of the contact plug 10.

Through the above-described process steps, the wiring layer 11 is electrically connected to the source/drain region 1a of the substrate 1 through the polysilicon plug 10. Typically, the wiring layer 11 serves as bit lines of a semiconductor memory device.

With the fabrication method of a semiconductor device according to the first embodiment of the present invention, as described above, the polysilicon wiring lines 5 (a first patterned conductive layer) are formed on the $SiO_2$ layer 2 (a first dielectric layer) and at the same time, the $Si_3N_4$ caps 4 (a second patterned dielectric layer) having the same plan shape as that of the wiring lines 5 are formed on the wiring lines 5. The wiring lines 5 are entirely covered with the BPSG layer 6 (a third dielectric layer) serving as an interlayer dielectric layer while the upper parts of the $Si_3N_4$ caps 4 are exposed from the BPSG layer 6. Moreover, the $Si_3N_4$ layer (a fourth dielectric layer) for forming the sidewall spacers 7 is formed to cover the both opposite sides of the exposed parts of the $Si_3N_4$ caps 4.

Thus, the both sides of the wiring lines 5 are covered with only the BPSG layer 6 having a lower dielectric constant than that of $Si_3N_4$. As a result, even if the dielectric caps 4 are made of $Si_3N_4$ having a higher dielectric constant, the parasitic capacitance caused by the wiring lines 5 and the wiring layer 11 can be suppressed.

Also, since the polysilicon plug 10 is electrically insulated from the wiring lines 5 by the BPSG layer 6 itself, it is unnecessary to form sidewall spacers used in the conventional method shown in FIGS. 1A to 1D in the contact hole 9. Thus, there is no possibility or danger that the contact resistance near the plug 10 becomes high due to decrease in actual or effective size of the contact hole 9.

Moreover, the top faces of the wiring lines 5 are covered with the dielectric caps 4 having the same plan shape as those of the wiring lines 5. The both side faces of the wiring lines 5 are covered with the dielectric sidewall spacers 7. Therefore, there is no possibility that the wiring lines 5 are exposed in the etching process of forming the contact hole 9, as shown in FIG. 3D. As a result, the contact hole 9 can be formed in self-alignment to the dielectric caps 4 and the sidewall spacers 7 (i.e., the wiring lines 5) while preventing the electrical short-circuit through the plug 10 filled in the hole 9.

SECOND EMBODIMENT

FIGS. 5A to 5E show a fabrication method of a semiconductor device according to a second embodiment of the present invention.

Figure 5A:
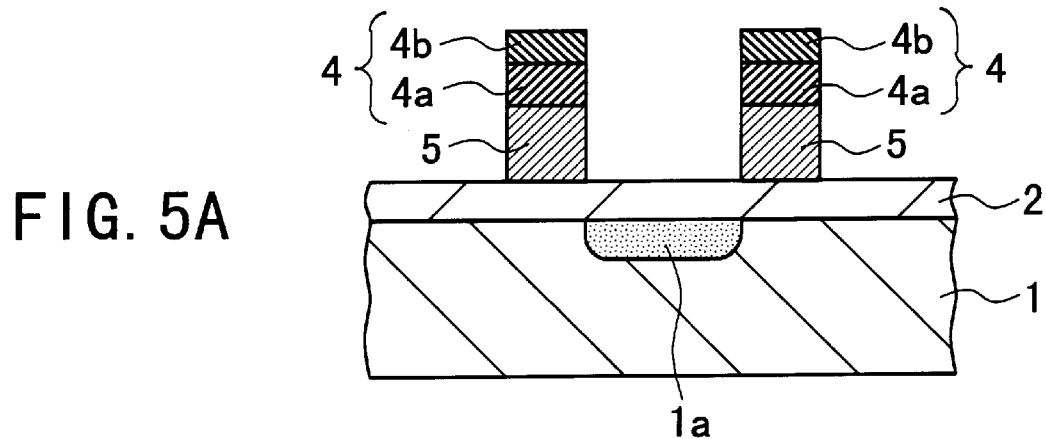
FIGS. 5A to 5E are partial cross-sectional views showing a fabrication method of a semiconductor device according to a second embodiment of the present invention, respectively.

First, as shown in FIG. 5A, after a single-crystal Si substrate 1 having a source/drain region 1a in its surface area is prepared, a $SiO_2$ layer 2 serving as an interlayer dielectric layer is formed on the surface of the substrate 1 by a thermal oxidation process or the like.

Next, a polysilicon layer (not shown) with a thickness of 200 nm is formed on the $SiO_2$ layer 2 by a CVD process, a $SiO_2$ layer (not shown) with a thickness of 100 nm is formed by a CVD process on the polysilicon layer thus deposited, and a $Si_3N_4$ layer (not shown) with a thickness of 100 nm is formed by a CVD process on the $SiO_2$ layer thus deposited. Thereafter, the polysilicon layer, the $SiO_2$ layer, and the $Si_3N_4$ layer are patterned to have a same specific plan shape by known photolithography and etching techniques, thereby forming polysilicon wiring lines 5 located on the $SiO_2$ layer 2 and two-layered dielectric caps 4 located on the wiring lines 5, as shown in FIG. 5A. Each of the dielectric caps 4 has a two-layer structure of a lower part 4a made of $SiO_2$ located on a corresponding one of the wiring lines 5 and an upper part 4b made of $Si_3N_4$ located on the lower part 4a.

The polysilicon layer, the $SiO_2$ layer, and the $Si_3N_4$ layer may be etched successively using a same mask. Alternatively, the uppermost $Si_3N_4$ layer is etched using a mask and then, the underlying $SiO_2$ and polysilicon layers may be successively etched using the patterned or etched $Si_3N_4$ layer as a mask. Any other process or processes may be used for this purpose if the top faces of the wiring lines 5 are covered with the two-layered dielectric caps 4.

The location of the wiring lines 5 and the dielectric caps 4 is determined so that the source/drain region 1a intervenes between the two adjoining wiring lines 5.

Subsequently, a BPSG layer 6 with a thickness of 600 nm is deposited by a CVD process on the $SiO_2$ layer 2 to cover the wiring lines 5 and the dielectric caps 4. The surface of the BPSG layer 6 is then planarized by a same process as that used in the first embodiment.

Figure 5B:
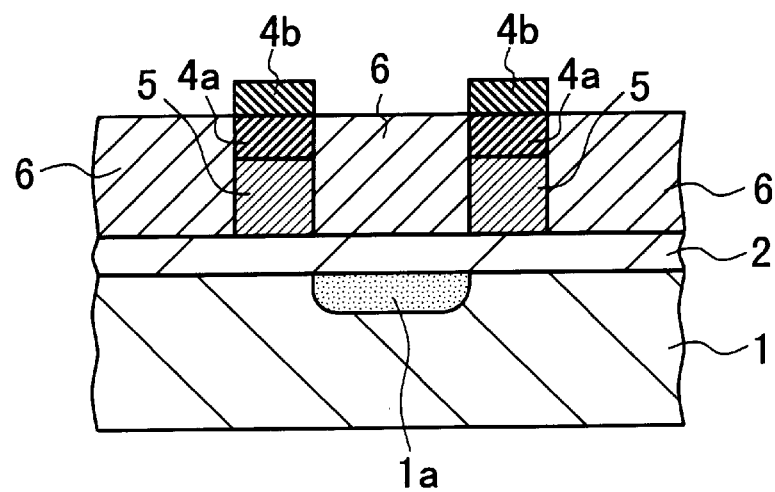

The BPSG layer 6 thus deposited is then etched back by a same process as that used in the first embodiment, thereby exposing the upper parts of the caps 4 from the BPSG layer 6, as shown in FIG. 5B. Since the surface of the BPSG layer 6 has been planarized, the thickness of the layer 6 is uniformly decreased by the etch pack process, resulting in exposure or protrusion of the upper parts 4b of the caps 4. The degree of exposure or protrusion of the caps 4 are determined, for example, in such a way that the exposed parts of the caps 4 have a thickness or height of approximately 200 nm, which is equal to half of the thickness of the caps 4. The state at this stage is shown in FIG. 5B.

Following this step, a $Si_3N_4$ layer (not shown) with a thickness of 100 nm is deposited on the remaining BPSG layer 6 by a CVD process. Since the $Si_3N_4$ layer has protrusions due to existence of the protruding dielectric caps 4 from the BPSG layer 6, the $Si_3N_4$ layer is selectively left only at the opposite sides of the caps 4 by etching back the $Si_3N_4$ layer by an anisotropic etching process. Thus, sidewall spacers 7 made of the remaining $Si_3N_4$ layer are formed on the BPSG layer 6, as shown in FIG. 5C.

Figure 5C:
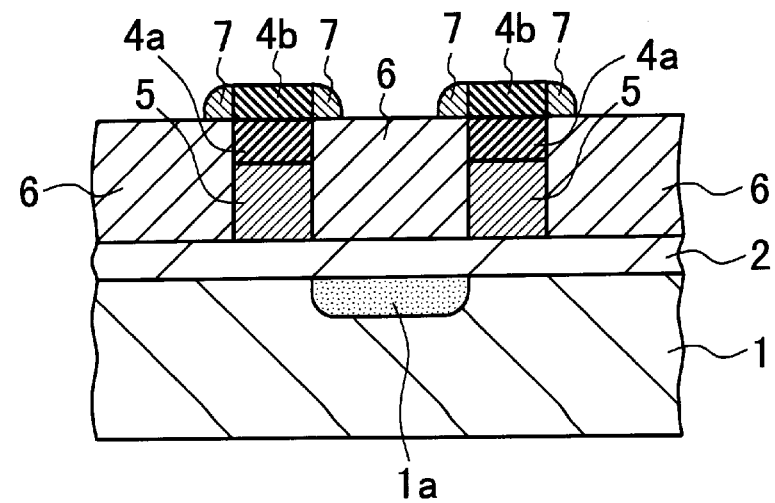

In the state of FIG. 5C, the top faces of the wiring lines 5 are covered with the $Si_3N_4$ caps 4 while the side faces wiring lines 5 are covered with the BPSG layer 6 and the sidewall spacers 7. The $Si_3N_4$ sidewall spacers 7 only cover the both side faces of the $Si_3N_4$ upper parts 4b of the caps 4.

Figure 5D:
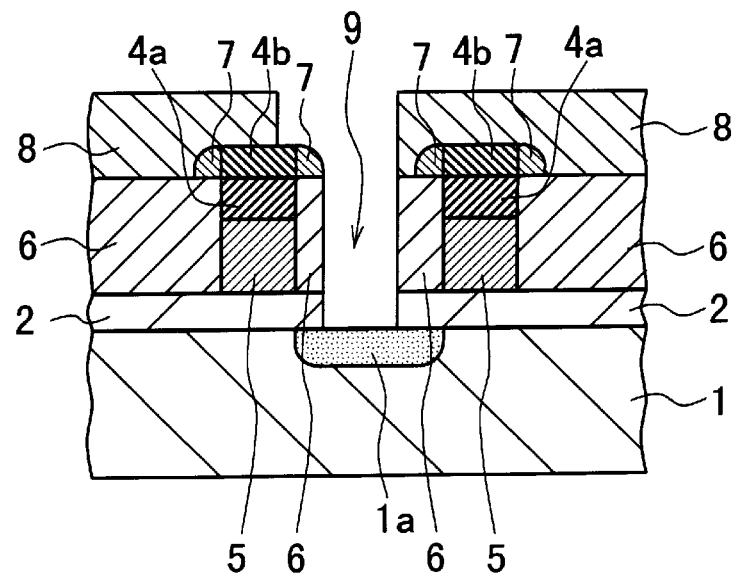

Subsequently, as shown in FIG. 5D, a BPSG layer 8 is deposited by a CVD process or the like on the remaining BPSG layer 6 as an interlayer dielectric layer covering the wiring lines 5, the exposed upper parts 4b of the caps 43, and the sidewall spacers 7. To remove protrusion of the BPSG layer 8, the surface of the BPSG layer 8 is then planarized by a CMP process.

Using a patterned photoresist film (not shown) by a photolithography technique as a mask, the surfaceplanarized BPSG layer 8 and the underlying $SiO_2$ layer 2 are selectively etched, thereby forming a contact hole 9, as shown in FIG. 5D. The contact hole 9 has a rectangular or circular plan shape, for example. The bottom of the hole 9 reaches the source/drain region 1a of the substrate 1.

In FIG. 5D, the contact hole 9 deviates laterally from its desired or correct position to the left-hand side. At the desired or correct position, the contact hole 9 is apart from the two adjoining wiring lines 5 and located in the middle of the source/drain region 1a.

To prevent or suppress the etching of the $Si_3N_4$ parts 4b and the $Si_3N_4$ sidewall spacers 7, the etching for the BPSG layer 8 and the $SiO_2$ layer 2 is carried out under the condition that the etch rate of BPSG and $SiO_2$ is sufficiently higher than that of $Si_3N_4$. For example, the BPSG layer 8 and the $SiO_2$ layer 2 are etched by a dry etching process using a gaseous mixture of $CHF_3$ and CO.

Figure 5E:
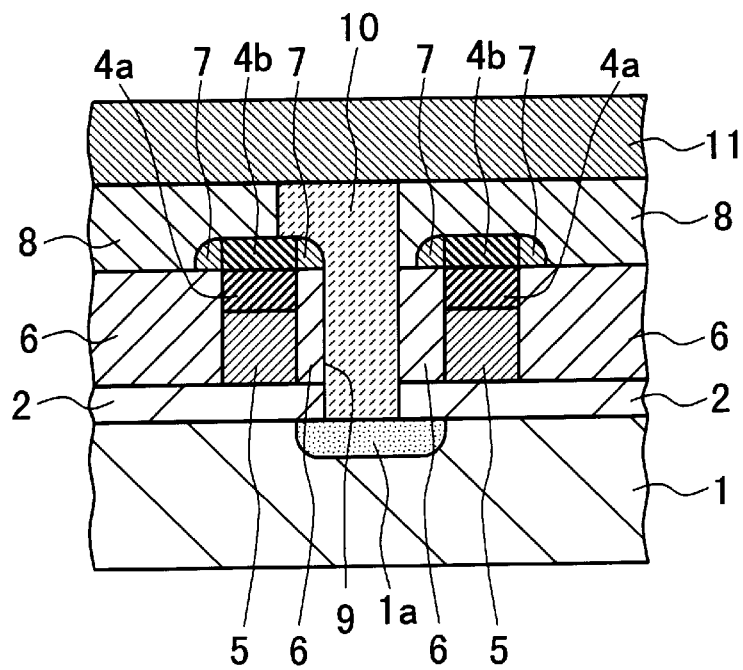

Next, a polysilicon layer (not shown) is deposited on the BPSG layer 8, in which the thickness of the polysilicon layer is determined to fill the whole contact hole 9. The polysilicon layer is then etched back until the surface of the underlying BPSG layer 8 is exposed, thereby selectively leaving the polysilicon layer only in the contact hole 9. Thus, a contact plug 10 made of the remaining polysilicon layer is formed in the contact hole 9, as shown in FIG. 5E. The bottom of the plug 10 is contacted with the source/drain region 1a of the substrate 1.

Thereafter, as shown in FIG. 5E, a conductive layer (not shown) is formed on the BPSG layer 8 and is patterned to have a specific pattern, resulting in a wiring layer 11. The conductive layer is typically made of polysilicon or metal. The bottom of the wiring layer 11 is contacted with the top of the contact plug 10.

Through the above-described process steps, the wiring layer 11 is electrically connected to the source/drain region 1a of the substrate 1 through the polysilicon plug 10. Typically, the wiring layer 11 serves as bit lines of a semiconductor memory device.

With the fabrication method of a semiconductor device according to the second embodiment of the present invention, as described above, substantially the same process steps as those in the method according to the first embodiment of FIGS. 3A to 3E are carried out except for the dielectric caps 4 have the two-layer structure of the lower $SiO_2$ parts 4a and the upper $Si_3N_4$ parts 4b. Thus, it is apparent that there are the same advantages as those in the first embodiment.

Since the dielectric caps 4 have the two-layer structure, the $SiO_4$ parts 4a intervene between the wiring lines 5 and the $Si_3N_4$ parts 4b. As a result, there is an additional advantage that the wiring-induced parasitic capacitance can be further decreased than that in the first embodiment.

In the above-described first and second embodiments, the contact hole 9 are located between the adjoining wiring lines 5. However, the present invention may be applied to contact holes of any other types located between any conductors such as gate electrodes of MOSFETs.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A fabrication method of a semiconductor device, comprising the steps of:

(a) forming a structure including a first dielectric layer formed directly on or indirectly over a semiconductor substrate through a layer; a first patterned conductive layer formed on said first dielectric layer; a second patterned dielectric layer formed on said first patterned conductive layer; and said second dielectric layer having approximately a same plan shape as that of said first patterned conductive layer;

(b) forming a third dielectric layer on said first dielectric layer;

said third dielectric layer serving as an interlayer dielectric layer covering entirely said first patterned conductive layer and covering partially said second patterned dielectric layer;

part of said second patterned dielectric layer being exposed from said third dielectric layer;

(c) forming a fourth dielectric layer on said third dielectric layer;

said fourth dielectric layer covering said part of said second patterned dielectric layer exposed from said third dielectric layer;

(d) patterning said fourth dielectric layer to form sidewall spacers for said part of said second patterned dielectric layer exposed from said third dielectric layer;

(e) forming a fifth dielectric layer serving as an interlayer dielectric layer covering said part of said second dielectric layer exposed from said third dielectric layer and said fourth patterned dielectric layer;

(f) forming a contact hole to penetrate through at least said fifth and third dielectric layers;

(g) forming a conductive plug to fill said contact hole;

said plug being contacted with a region of said substrate or a conductive layer located between said substrate and said first dielectric layer;

said plug being electrically insulated from said first patterned conductive layer by said third dielectric layer itself in said contact hole; and (h) forming a second conductive layer on said fifth dielectric layer;

said second conductive layer being contacted with said conductive plug;

said second conductive layer being electrically connected with said region of said substrate or said conductive layer located between said substrate and said first dielectric layer through said conductive plug.

2. The method as claimed in claim 1, wherein said second patterned dielectric layer is made of silicon nitride.

3. The method as claimed in claim 1, wherein said second patterned dielectric layer has a two-layer structure comprising a silicon nitride sublayer and a silicon oxide sublayer;

and wherein said silicon oxide sublayer is located between said silicon nitride sublayer and said first conductive layer.

4. The method as claimed in claim 1, wherein said fourth dielectric layer is made of silicon nitride.

5. The method as claimed in claim 1, wherein said step (b) of forming said third dielectric layer is comprised of:

(b-1) a first substep of forming a base dielectric layer on said first dielectric layer to entirely cover both said first patterned conductive layer and said third dielectric layer;

(b-2) a second substep of planarizing a surface of said base dielectric layer; and (b-3) a third substep of etching back said planarized surface of said base dielectric layer to expose at least part of said second patterned dielectric layer.

* * * * *